United States Patent
Wang et al.

(10) Patent No.: US 6,858,355 B2
(45) Date of Patent: Feb. 22, 2005

(54) MASK AND METHOD FOR DEFINING A GUARD RING PATTERN

(75) Inventors: Hsien-Jung Wang, Taipei (TW); Yuan-Hsun Wu, Chungli (TW)

(73) Assignee: Nanya Technology Corporation, Taoyuan (TW)

( * ) Notice: Subject to any disclaimer, the term of this patent is extended or adjusted under 35 U.S.C. 154(b) by 166 days.

(21) Appl. No.: 10/319,076

(22) Filed: Dec. 13, 2002

(65) Prior Publication Data

US 2004/0053142 A1 Mar. 18, 2004

(30) Foreign Application Priority Data

Sep. 12, 2002 (TW) ........................................ 91120864 A

(51) Int. Cl.⁷ ............................. G03F 9/00; G03C 5/00
(52) U.S. Cl. ........................................... 430/5; 430/394
(58) Field of Search .......................... 430/5, 311, 312, 430/394

(56) References Cited

U.S. PATENT DOCUMENTS 5,879,838 A * 3/1999 Lee ................................ 430/5

\* cited by examiner

*Primary Examiner*—S. Rosasco
(74) *Attorney, Agent, or Firm*—Quintero Law Office

(57) ABSTRACT

A mask for defining a guard ring pattern. The mask includes a transparent substrate, a light-shielding layer, and at least one pair of assisted line patterns. The light-shielding layer is disposed on the transparent substrate and has a rectangular ring pattern composed of a plurality of opening patterns to define the guard ring pattern. The pair of assisted line patterns is parallelized by a predetermined interval on both sides of at least one section of the rectangular ring and have a predetermined width. Moreover, a method for defining a guard ring pattern is disclosed. First, a semiconductor substrate covered by an energy sensitive layer is provided. Next, photolithography is performed on the energy sensitive layer using the mask to transfer the guard ring pattern inside.

19 Claims, 5 Drawing Sheets

MASK AND METHOD FOR DEFINING A GUARD RING PATTERN

BACKGROUND OF THE INVENTION

1. Field of the Invention

The invention relates to a mask for photolithography, and more particularly to a mask and method for defining a guard ring pattern.

2. Description of the Related Art

Memory devices of integrated circuits (ICs), such as a dynamic random access memory (DRAM) typically include a memory array region and a logic circuit region (or peripheral circuit region), wherein a guard ring is disposed around the logic circuit region to prevent electrostatic discharge or circuit noise from damaging the memory device.

Conventionally, the fabrication of the guard ring forms a ring region composed of a plurality of trenches in the substrate around the logic circuit region. Next, ion implantation is performed on those trenches to form a ring-shaped doping strap serving as a guard ring region. The trenches used for the fabrication of the guard ring are isolated, but those used for the fabrication of the logic circuit are dense. It is difficult to define all the trench patterns on the guard ring region when photolithography is performed to simultaneously define the guard ring and logic circuit regions.

FIG. 1 is a plane view of a conventional mask for defining a guard ring pattern. The mask includes a transparent substrate 10 and a light-shielding layer 12 thereon. The light-shielding layer 12, such as chromium, has a memory array pattern (not shown), a logic circuit pattern 16, and a plurality of rectangular opening patterns 14 around the logic circuit pattern 16. The logic circuit pattern 16 is composed of dense lines/spaces. Here, in order to simplify the diagram, only a blank block is shown. In addition, the rectangular opening patterns 14 define a guard ring pattern.

FIG. 2 is a plane view of a patterned photoresist layer formed by the mask in FIG. 1. A semiconductor substrate 20 is covered by a photoresist layer 21. After photolithography is performed on the photoresist layer 21 using the mask in FIG. 1, the patterns 16, 14 are transferred to the photoresist layer 21, thereby forming a guard ring pattern composed of rectangular opening patterns 24 around a logic circuit pattern 26 inside.

Unfortunately, since received dose in photoresist layer 21 for dense pattern (logic circuit pattern 26) and isolated pattern (guard ring pattern) are different to induce optical proximity effect (OPE), some opening patterns 14 cannot transfer to the photoresist layer 21 after developing. As a result, non-pattern region 22 or pin-hole pattern 23 are formed therein instead of the opening pattern 24. That is, an incomplete guard ring structure is formed in the substrate 20, thus the protection function fails.

SUMMARY OF THE INVENTION

Accordingly, an object of the invention is to provide a method and mask for defining a guard ring pattern using additional assisted line patterns to prevent optical proximity effect (OPE), thereby defining a complete guard pattern and increasing the process window of photolithography.

To achieve these and other advantages, the invention provides a mask for defining a guard ring pattern. The mask includes a transparent substrate, a light-shielding layer, and at least one pair of assisted line patterns. The light-shielding layer is disposed on the transparent substrate having a rectangular ring pattern composed of a plurality of opening patterns to define the guard ring pattern. The pair of assisted line patterns are parallelized by a predetermined interval on both sides of at least one section of the rectangular ring and have a predetermined width, wherein the ratio of the predetermined interval to the predetermined width is about 1~5:1. Moreover, the transparent substrate is quartz, and the light-shielding layer is chromium. The opening pattern is rectangular, and the assisted line pattern is a linear opening pattern.

Moreover, the present invention also provides a method for defining a guard ring pattern. First, a semiconductor substrate covered by an energy sensitive layer is provided. Subsequently, a photolithography is performed on the energy sensitive layer by a mask, wherein the mask includes a transparent substrate, a light-shielding layer having a rectangular ring composed of a plurality of opening patterns, and at least one pair of assisted line patterns parallelized by a predetermined interval on both sides of at least one section of the rectangular ring and having a predetermined width. The ratio of the predetermined interval to the predetermined width is about 1~5:1. Moreover, the opening pattern is rectangular, and the assisted line pattern is a linear opening.

DESCRIPTION OF THE DRAWINGS

For a better understanding of the present invention, reference is made to a detailed description to be read in conjunction with the accompanying drawings, in which.

DETAILED DESCRIPTION OF THE INVENTION

Figure 3:
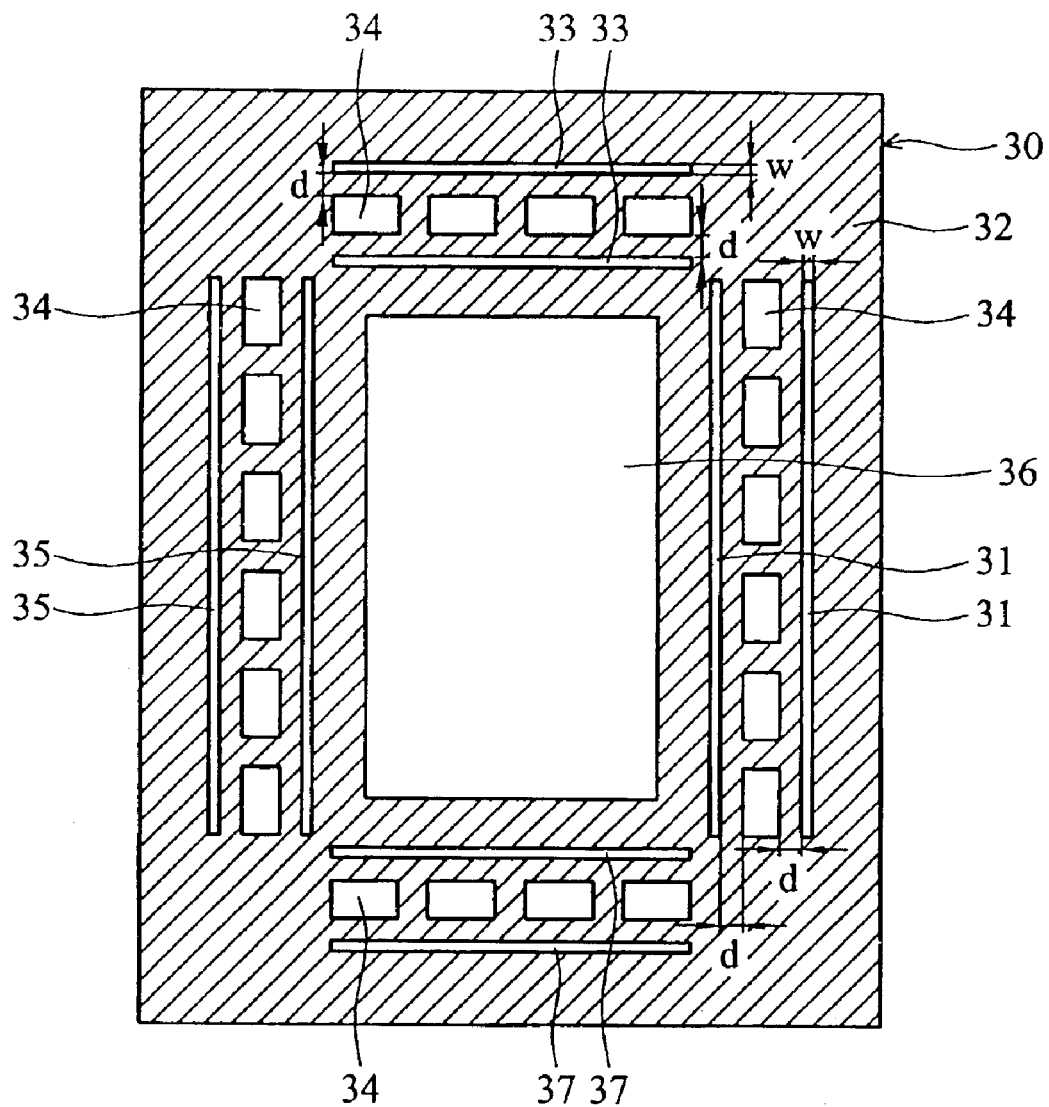
FIG. 3 is a plane view of a mask for defining a guard ring pattern according to the present invention.

FIG. 3 is a plane view of a mask for defining a guard ring pattern according to the present invention. The mask includes a transparent substrate 30, such as quartz, and a light-shielding layer 32 thereon. The light-shielding layer 32, such as chromium, has a memory array pattern (not shown), a logic circuit pattern 36, and a plurality of opening patterns 34, such as rectangular opening patterns, around the logic circuit pattern 36 for the fabrication of a memory device.

As mentioned above, the logic circuit pattern 36 is composed of dense lines/spaces. Also, in order to simplify the diagram, only a blank block is shown. In addition, a rectangular ring composed of a plurality of opening patterns 34 is used for defining the guard ring pattern. These rectangular opening patterns 34 are isolated patterns, different from the memory array pattern or logic circuit pattern 36.

In this invention, the mask defining the guard ring pattern, for example, has four pairs of assisted line patterns 31, 33, 35, 37, such as linear opening patterns, each with a predetermined width w. The four pairs of assisted line patterns 31, 33, 35, 37 are respectively parallelized by a predetermined interval d on both sides (inside and outside) of each section of the rectangular ring. These linear opening patterns 31, 33, 35, 37 are used as assisted patterns for optical proximity effect correction (OPC), so as to successfully transfer every rectangular opening pattern 34 in the photoresist layer or other energy sensitive layer in photolithography. In addition, it is noted that these linear opening patterns 31, 33, 35, 37 are not allowed to transfer to the energy sensitive layer 41. In order to achieve this object, the ratio of the predetermined interval d to the predetermined width w (d/w) is about 1~5:1. For example, the interval d is about 300 nm, and the width d is about 100 nm.

Figure 4:
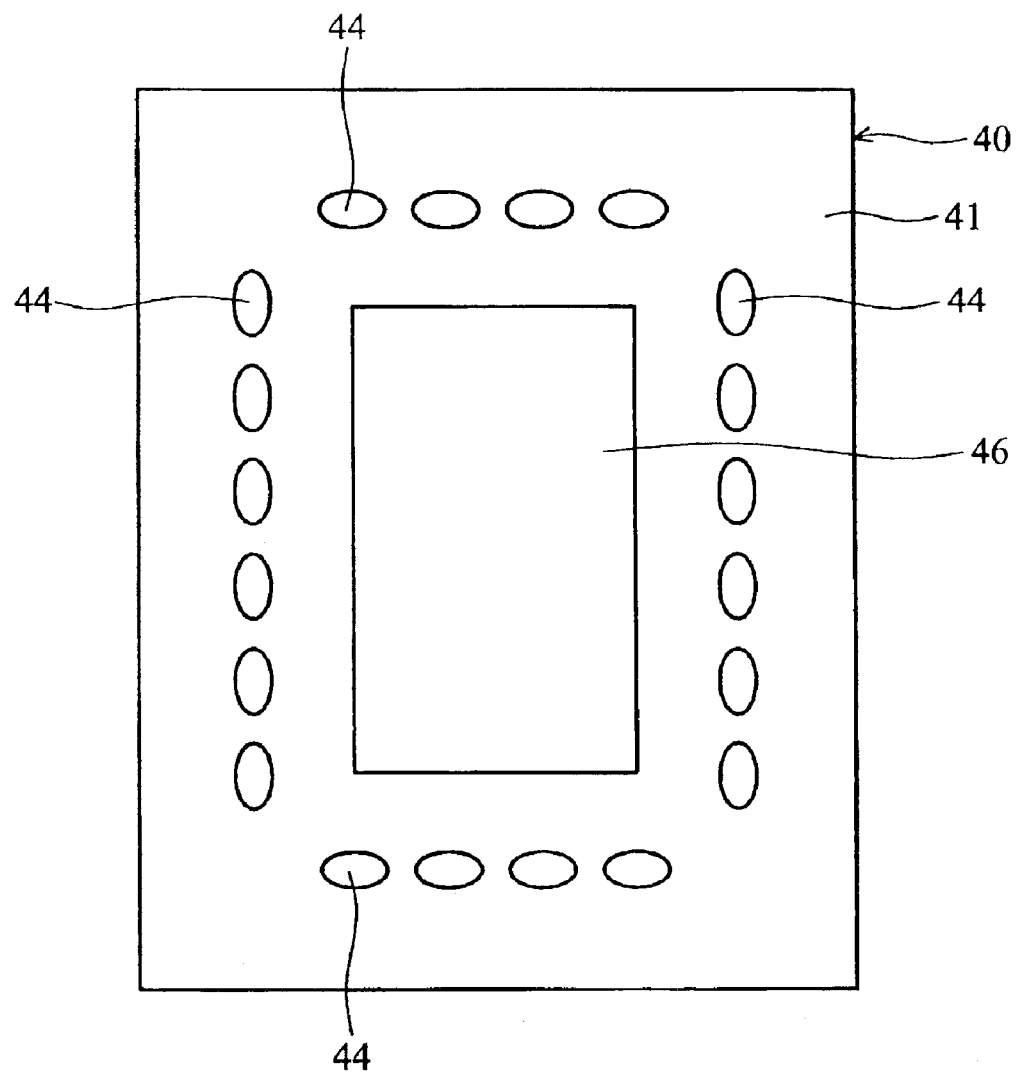
FIG. 4 is a plane view of a patterned photoresist layer formed by the mask in FIG. 3.

FIG. 4 is a plane view of a patterned photoresist layer formed by the mask in FIG. 3. First, a semiconductor substrate 40 covered by an energy sensitive layer 41, such as photoresist, is provided. After photolithography is performed using the mask in FIG. 3, the patterns 34, 36 on the mask are transferred to the energy sensitive layer 41 to form a logic circuit pattern 46 and a guard ring pattern composed of the opening patterns 44. As mentioned above, received dose in energy sensitive layer 41 for dense pattern (logic circuit pattern 46) and isolated pattern (guard ring pattern) are different to induce optical proximity effect (OPE). However, OPE can be eliminated through these assisted line patterns 31, 33, 35, 37, thereby transferring every rectangular opening pattern 34 to the energy sensitive layer 41. That is, according to the invention, a complete guard ring pattern can be formed in the energy sensitive layer 41. Accordingly, a complete guard ring structure can be formed in the substrate 40 after etching, thereby increasing the reliability of memory device.

Figure 1:
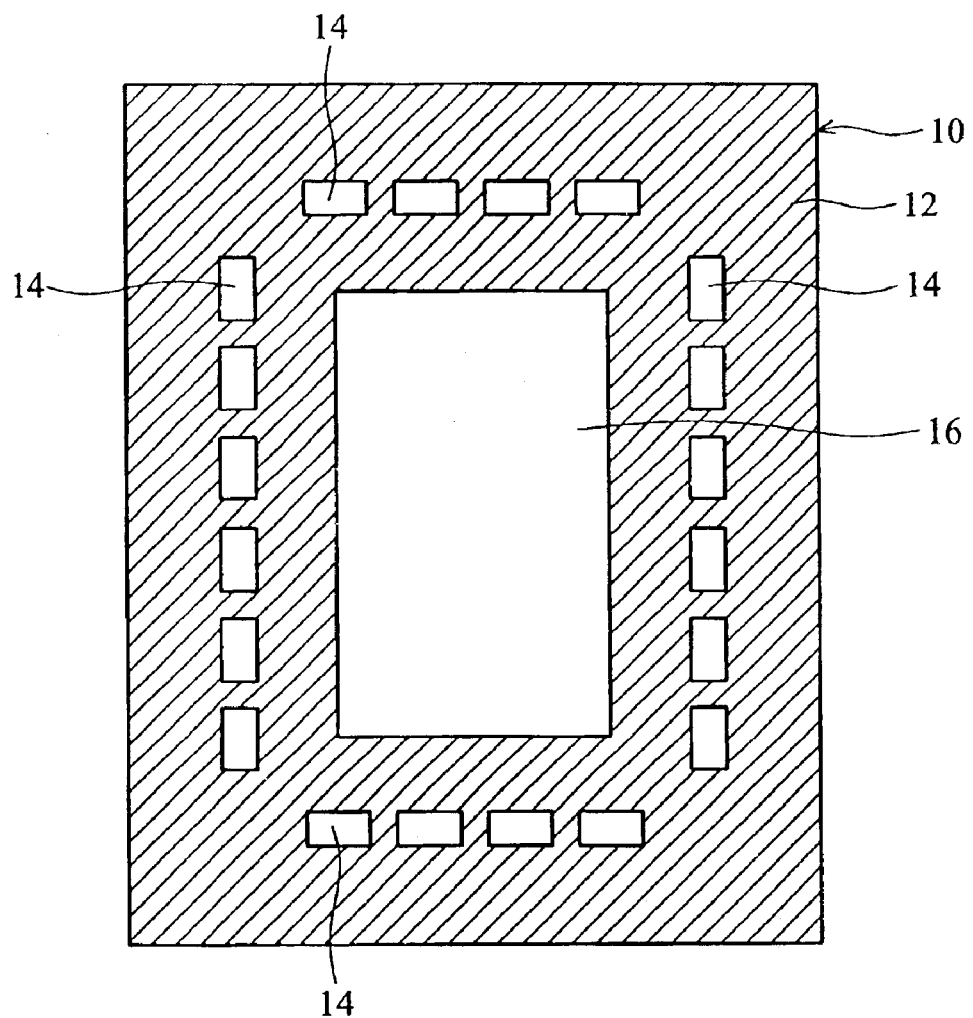
FIG. 1 is a plane view of a conventional mask for defining a guard ring pattern.
Figure 2:
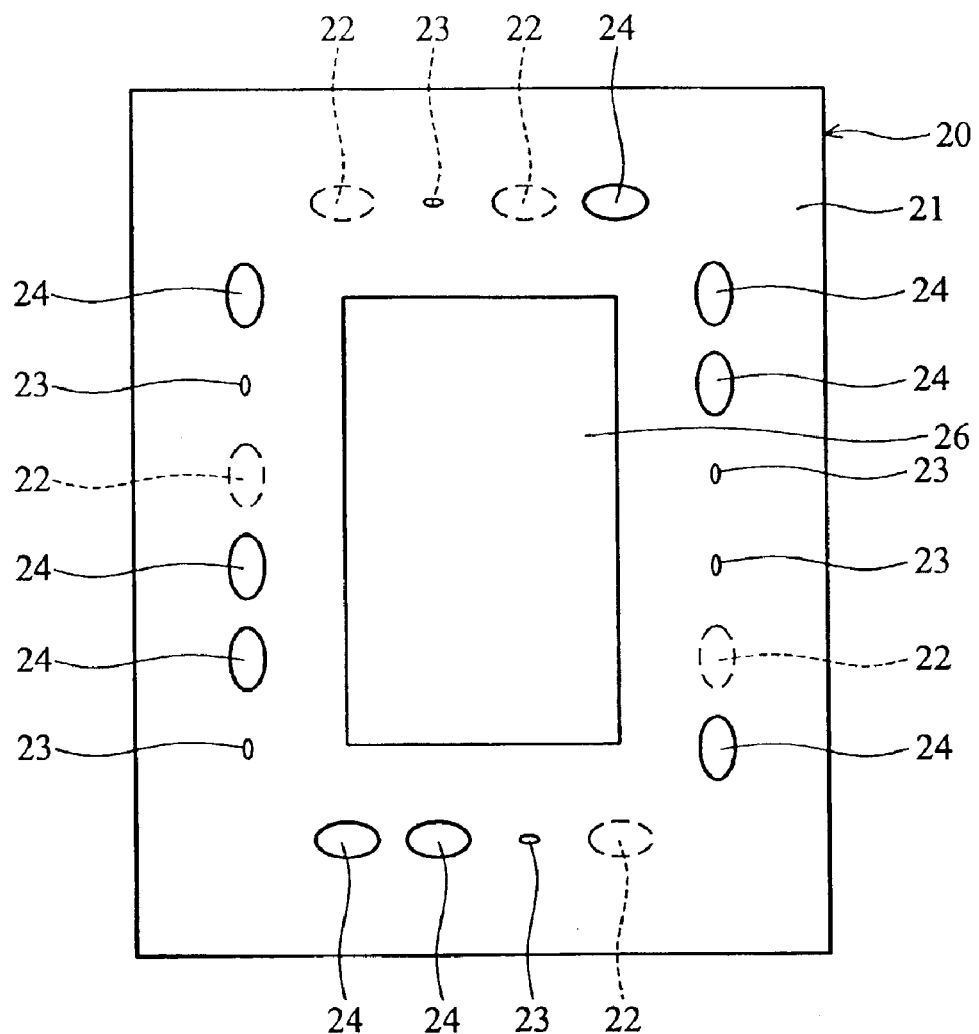
FIG. 2 is a plane view of a patterned photoresist layer formed by the mask in FIG. 1.
Figure 5:
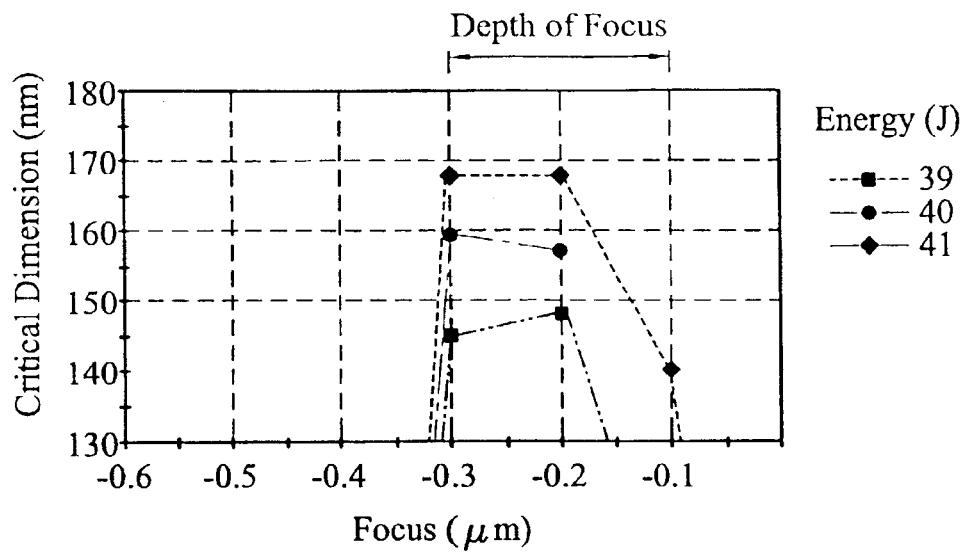
FIG. 5 is a graph of CD of the patterned photoresist layer versus focus for photolithography using the mask in FIG. 1.
Figure 6:
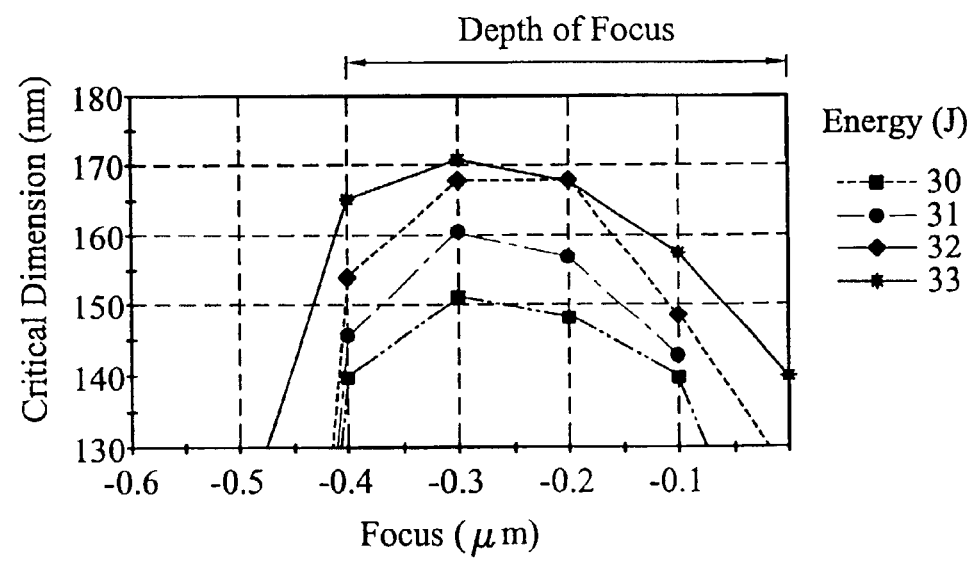
FIG. 6 is a graph of CD of the patterned photoresist layer versus focus for photolithography using the mask in FIG. 3.

FIGS. 5 and 6 are a graph of critical dimension (CD) of the patterned photoresist layer versus focus for photolithography using the mask in FIG. 1 and in FIG. 3, respectively. For example, if the desired CD is 150±10% nm, the exposing energy required is higher (above 38 joule (J)) and the depth of focus (DOF) is shorter (abut 0.1~0.2 $\mu$m) using the conventional mask, as shown in FIG. 5. On the contrary, in the same CD, the exposing energy required is lower (below 33 J) and the DOF is longer (abut 0.3~0.4 $\mu$m) using the mask of the invention, as shown in FIG. 6.

Accordingly, the process window of photolithography can be increased by increasing the DOF using the mask of the invention. Moreover, the process window difference between the dense and isolated patterns can be reduced, so as to form a complete guard ring pattern.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A mask for defining a guard ring pattern, comprising:
a transparent substrate;
a light-shielding layer disposed on the transparent substrate having a rectangular ring composed of a plurality of opening patterns to define the guard ring pattern; and
at least one pair of assisted line patterns parallelized by a predetermined interval on both sides of at least one section of the rectangular ring and having a predetermined width.

2. The mask as claimed in claim 1, wherein the transparent substrate is quartz.

3. The mask as claimed in claim 1, wherein the light-shielding layer is chromium.

4. The mask as claimed in claim 1, wherein the opening patterns are rectangular.

5. The mask as claimed in claim 1, wherein the assisted line pattern is a linear opening.

6. The mask as claimed in claim 1, wherein the ratio of the predetermined interval to the predetermined width is about 1~5:1.

7. The mask as claimed in claim 1, wherein the predetermined interval is about 300 nm.

8. The mask as claimed in claim 1, wherein the predetermined width is about 100 nm.

9. The mask as claimed in claim 1, further comprising a logic circuit pattern disposed inside the rectangular ring.

10. The mask as claimed in claim 1, wherein four pairs of the assisted line patterns are respectively parallelized by a predetermined interval on both sides of each section of the rectangular ring and have a predetermined width.

11. A method for defining a guard ring, comprising the steps of:
providing a semiconductor substrate covered by an energy sensitive layer; and
performing photolithography on the energy sensitive layer by a mask, wherein the mask comprises a light-shielding layer having a rectangular ring composed of a plurality of opening patterns, and at least one pair of assisted line patterns parallelized by a predetermined interval on both sides of at least one section of the rectangular ring and having a predetermined width.

12. The method as claimed in claim 11, wherein the light-shielding layer is chromium.

13. The method as claimed in claim 11, wherein the opening patterns are rectangular.

14. The mask as claimed in claim 11, wherein the assisted line pattern is a linear opening.

15. The method as claimed in claim 11, wherein the ratio of the predetermined interval to the predetermined width is about 1~5:1.

16. The method as claimed in claim 11, wherein the predetermined interval is about 300 nm.

17. The method as claimed in claim 11, wherein the predetermined width is about 100 nm.

18. The method as claimed in claim 11, further comprising a logic circuit pattern disposed inside the rectangular ring.

19. The method as claimed in claim 11, wherein four pairs of the assisted line patterns are respectively parallelized by a predetermined interval on both sides of each section of the rectangular ring and have a predetermined width.

* * * * *